(12) United States Patent
Ha (10) Patent No.: US 7,626,865 B2
(45) Date of Patent: Dec. 1, 2009

(54) CHARGE PUMP OPERATION IN A NON-VOLATILE MEMORY DEVICE

(75) Inventor: Chang Wan Ha, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 317 days.

(21) Appl. No.: 11/451,822

(22) Filed: Jun. 13, 2006

(65) Prior Publication Data

US 2007/0291547 A1     Dec. 20, 2007

(51) Int. Cl.
    *G11C 11/34* (2006.01)
(52) U.S. Cl. ............... 365/185.18; 365/185.25; 365/189.09; 365/189.11; 365/226
(58) Field of Classification Search ............. 365/185.18
    See application file for complete search history.

(56) References Cited

U.S. PATENT DOCUMENTS

| | | | | |
|---|---|---|---|---|
| 5,740,109 A | * | 4/1998 | Morton et al. | 365/185.18 |
| 5,945,870 A | * | 8/1999 | Chu et al. | 327/536 |
| 6,259,632 B1 | * | 7/2001 | Khouri et al. | 365/185.23 |
| 6,259,635 B1 | * | 7/2001 | Khouri et al. | 365/189.09 |
| 6,278,639 B1 | * | 8/2001 | Hosono et al. | 365/189.09 |
| 6,356,469 B1 | | 3/2002 | Roohparvar et al. | |
| 6,385,065 B1 | | 5/2002 | Roohparvar et al. | |
| 6,438,032 B1 | * | 8/2002 | Pekny et al. | 365/185.18 |
| 6,480,436 B2 | | 11/2002 | Confalonieri et al. | |
| 6,498,761 B2 | * | 12/2002 | Banba et al. | 365/226 |
| 6,518,828 B2 | * | 2/2003 | Seo et al. | 327/534 |
| 6,538,930 B2 | * | 3/2003 | Ishii et al. | 365/189.09 |
| 6,560,145 B2 | | 5/2003 | Martines et al. | |
| 6,573,780 B2 | | 6/2003 | Lin et al. | |
| 6,633,494 B2 | | 10/2003 | Roohparvar et al. | |
| 6,661,682 B2 | | 12/2003 | Kim et al. | |
| 6,683,488 B2 | | 1/2004 | Jin | |
| 6,735,118 B2 | * | 5/2004 | Ogura et al. | 365/185.18 |
| 6,765,428 B2 | | 7/2004 | Kim et al. | |
| 6,785,180 B2 | | 8/2004 | Cheung | |
| 6,788,578 B1 | | 9/2004 | Tang | |
| 6,801,455 B2 | * | 10/2004 | Natori | 365/185.18 |
| 6,912,172 B2 | * | 6/2005 | Honma et al. | 365/226 |
| 6,933,768 B2 | | 8/2005 | Hausmann | |
| 6,937,517 B2 | * | 8/2005 | Pekny et al. | 365/185.18 |
| 7,274,602 B2 | * | 9/2007 | Arakawa | 365/189.09 |
| 7,385,377 B2 | * | 6/2008 | Pisasale et al. | 323/267 |
| 7,439,797 B2 | * | 10/2008 | Byeon et al. | 327/540 |
| 2005/0057236 A1 | * | 3/2005 | Telecco | 323/274 |

* cited by examiner

Primary Examiner—Viet Q Nguyen
(74) Attorney, Agent, or Firm—Jeffert Jay & Polglaze, P.A.

(57) ABSTRACT

A charge pump in a memory device is activated to produce a programming voltage prior to data loading during a programming operation. During an initial programming cycle, first and second load voltages are charged from the charge pump. The first load is removed from the charge pump during a verify operation. The first load voltage is subsequently recharged by charge sharing from the second load voltage so that the charge pump is not initially necessary for recharging the first load voltage.

11 Claims, 5 Drawing Sheets

CHARGE PUMP OPERATION IN A NON-VOLATILE MEMORY DEVICE

TECHNICAL FIELD OF THE INVENTION

The present invention relates generally to memory devices and in particular the present invention relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

A charge pump circuit is used in a non-volatile memory device to generate the voltages required for chip operation. A charge pump is an electronic circuit that uses capacitors as energy storage elements to convert DC voltages into other DC voltages.

A typical charge pump uses transistors to control the operation of the pump and connection of voltages to the capacitors. For instance, a typical prior art charge pump can generate a higher voltage through multiple stages. A first stage involves a capacitor being connected across a voltage and charged up. In a second stage, the capacitor is disconnected from the original charging voltage and reconnected with its negative terminal to the original positive charging voltage. Because the capacitor mostly retains the voltage across it, except for leakage, the positive terminal voltage is added to the original, effectively doubling the voltage. The pulsing nature of the higher voltage output is typically smoothed by the use of another capacitor at the output.

Figure 1:
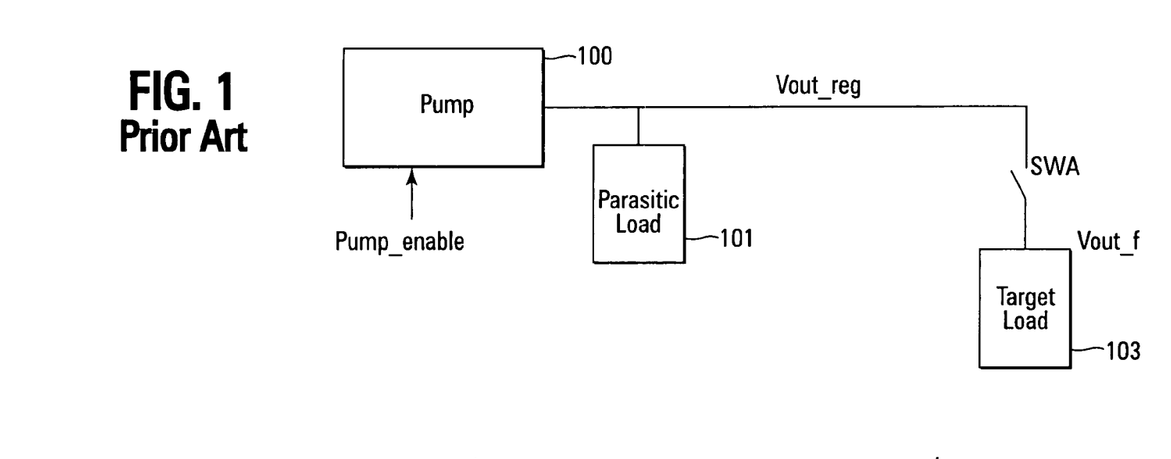
FIG. 1 shows a block diagram of a typical prior art charge pump circuit.

FIG. 1 illustrates a typical prior art charge pump circuit. It comprises a charge pump 100 that outputs regulated voltage $V_{out\_reg}$ to a parasitic load 101 and a target load 103. The parasitic load 103 represents line capacitance of the pump output node. The target load 103 is the capacitance of the connected word line to be programmed. Switch $SW_A$ 105 is closed during the programming cycles to connect $V_{out\_reg}$ to the target load 103.

Figure 2:
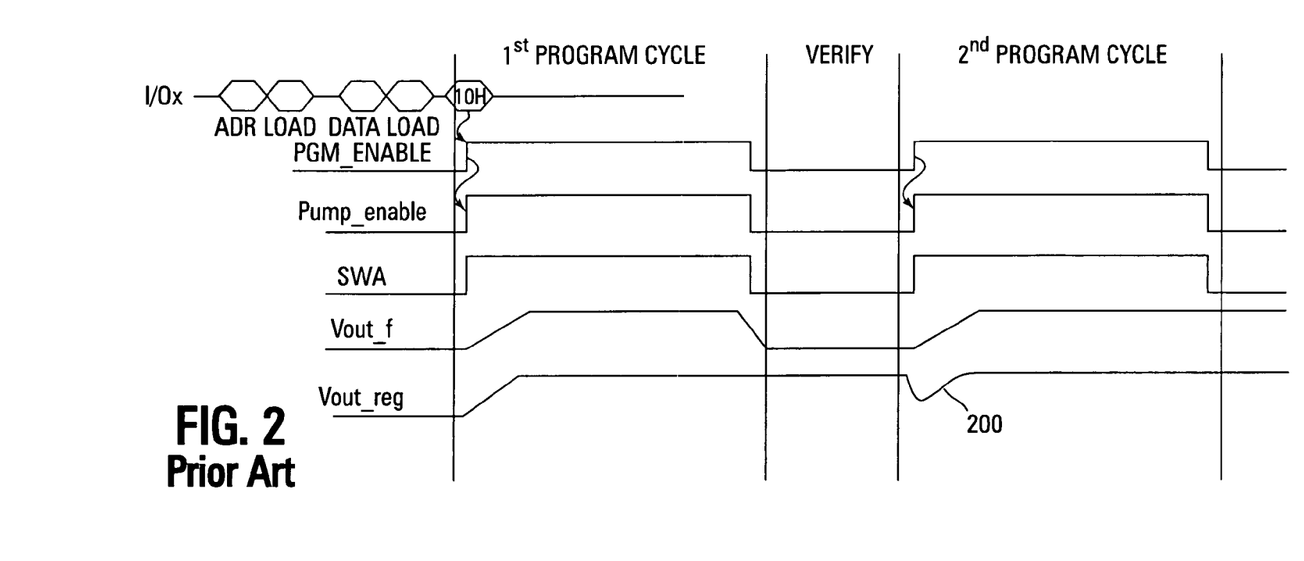
FIG. 2 shows a timing diagram of a typical prior art operation of the charge pump circuit of FIG. 1.

FIG. 2 illustrates a timing chart of a typical prior art non-volatile memory device such as the flash memory integrated circuit charge pump circuit of FIG. 1. The timing chart shows that the I/O lines include the addresses, data, and commands for memory operation.

Referring to FIG. 2, when the command for a program operation is received (e.g., 10H), a program enable signal goes high. The program enable signal then causes the charge pump enable signal to go high to initiate the pumping operation in order to precharge bit lines.

One problem with this charge pump operation is that the operation of the pump circuits causes noise on the bit lines. This can cause problems with programming of the cells that are coupled to the bit lines experiencing the noise. Additionally, a fast pump turn-on creates a peak current that causes a downward spike 200 in the supply voltage ($V_{CC}$) as illustrated in FIG. 2. This can result in unstable memory device operation.

For the reasons stated above, and for other reasons stated below which will become apparent to those skilled in the art upon reading and understanding the present specification, there is a need in the art for more efficient use of charge pumps in a non-volatile memory device.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 3:
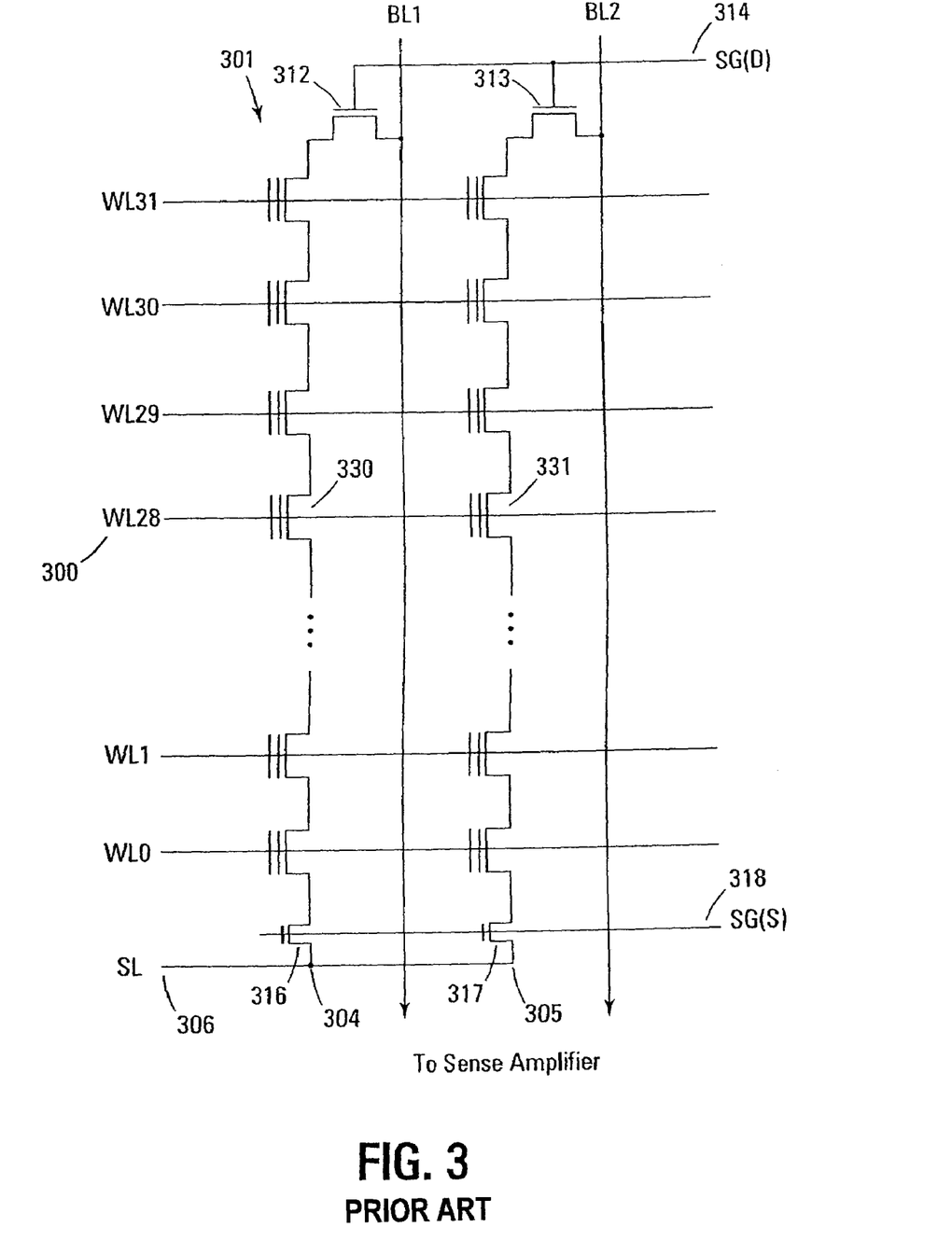
FIG. 3 shows a portion of one embodiment of a NAND architecture flash memory array.

FIG. 3 illustrates a simplified diagram of a typical prior art NAND flash memory array. The memory array of FIG. 3, for purposes of clarity, does not show all of the elements typically required in a memory array. For example, only two bit lines are shown (BL1 and BL2) when the number of bit lines required actually depends upon the memory density.

The array is comprised of an array of floating gate cells 301 arranged in series strings 304, 305. Each of the floating gate cells 301 are coupled drain to source in each series chain 304, 305. A word line (WL0-WL31) that spans across multiple series strings 304, 305 is coupled to the control gates of every floating gate cell in a row in order to control their operation. The bit lines BL1, BL2 are eventually coupled to sense amplifiers (not shown) that detect the state of each cell.

In operation, the word lines (WL0-WL31) select the individual floating gate memory cells in the series chain 304, 305 to be written to or read from and operate the remaining floating gate memory cells in each series string 304, 305 in a pass through mode. Each series string 304, 305 of floating gate memory cells is coupled to a source line 306 by a source select gate 316, 317 and to an individual bit line (BL1, BL2) by a drain select gate 312, 313. The source select gates 316, 317 are controlled by a source select gate control line SG(S) 318 coupled to their control gates. The drain select gates 312, 313 are controlled by a drain select gate control line SG(D) 314.

A selected word line 300 for the flash memory cells 330-331 being programmed is typically biased by programming pulses that start at a voltage of around 16V and may incrementally increase to more than 20V. The unselected word lines for the remaining cells are typically biased at $V_{pass}$. This is typically in an approximate range of 9-10V. The bit lines of the cells to be programmed are typically biased at 0V while the inhibited bit lines are typically biased at $V_{CC}$.

Figure 4:
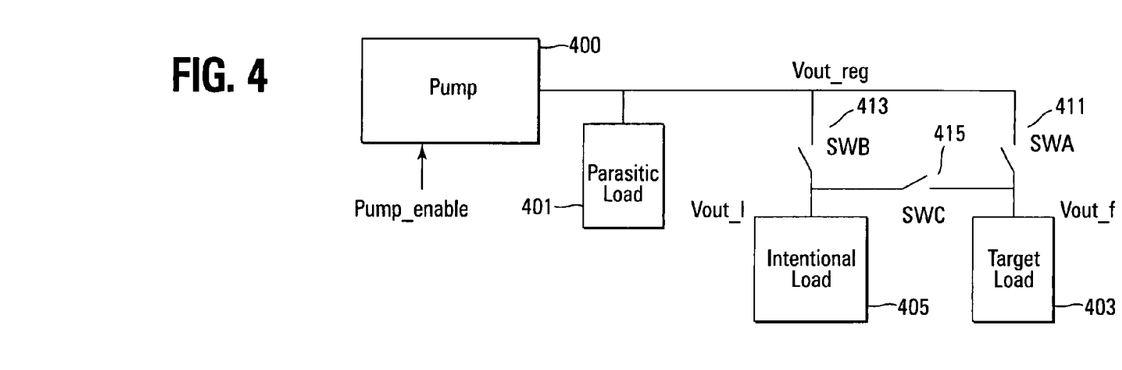
FIG. 4 shows an operational block diagram of one embodiment of a charge pump circuit of the present invention.

FIG. 4 illustrates an operational block diagram of one embodiment of the charge pump circuit of the present invention. The circuit is comprised of the charge pump device 400 that generates the $V_{out\_reg}$ voltage for programming the memory cells. In one embodiment, this voltage is coupled to the word lines of the subsequently described non-volatile memory array.

The parasitic load 401 represents the total capacitance of the output line of the charge pump device 400. The target load 403 represents the load capacitance of the word line to which the charge pump device 400 is currently coupled for programming. The intentional load 405 represents the load that is charged up during idle times to provide charge sharing with the target load.

Switches SWA 411, SWB 413, and SWC 415 provide the switching between the loads. In one embodiment, these switches 411, 413, 415 can be implemented using transistors. SWA 411 couples the target load 403 to the pump 400. SWB 413 couples the intentional load 405 to the pump. SWC 415 couples the intentional load 405 to the target load 403.

Figure 5:
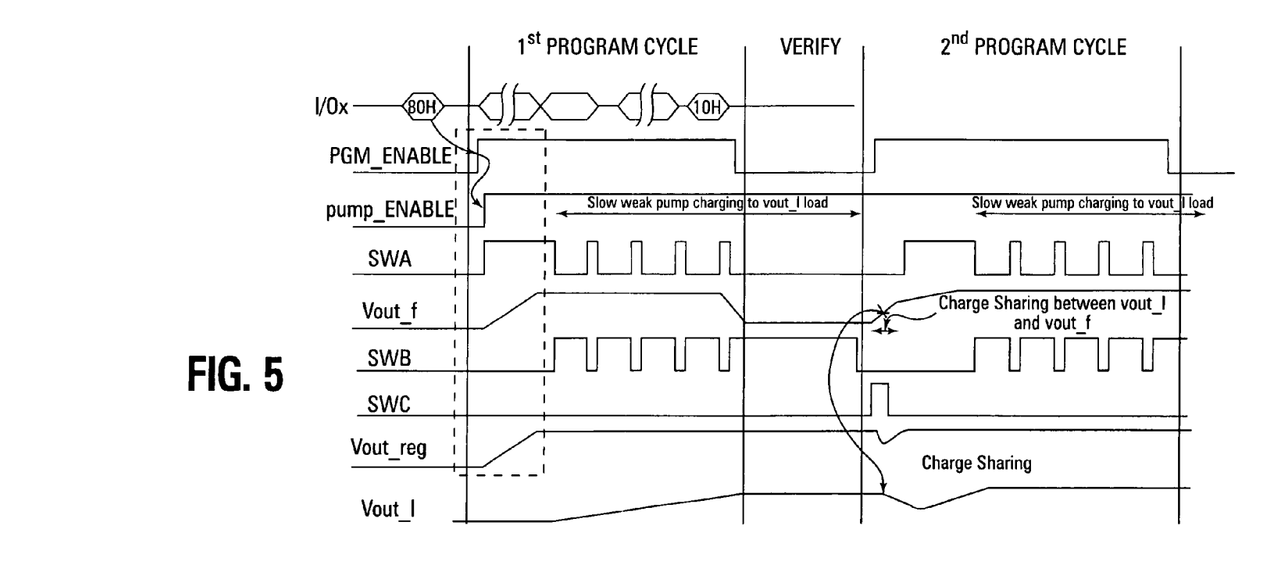
FIG. 5 shows a timing diagram of one embodiment of the operation of the charge pump circuit of FIG. 5.

FIG. 5 illustrates a timing diagram of one embodiment of the circuit of FIG. 4. This diagram illustrates the I/Ox line that carries the desired operation commands (i.e., read, write, erase), the data to be programmed/read, and the address to which the data is to be written/read.

The PGM_ENABLE line illustrates the state of the program enable signal to memory controller circuit to initiate the program operation. This signal also causes the memory controller to generate the PUMP_ENABLE signal. This signal is responsible for enabling the charge pump device 400 of FIG. 4 to begin the programming operation.

The $V_{out\_f}$ signal represents the voltage on the target load as a result of the closing of SWC 415. $V_{out\_reg}$ signal is the voltage that is output from the pump 400. $V_{out\_l}$ is the voltage at the intentional load 405. The SWA, SWB, and SWC lines represent the opening and closing of the switches 411, 413, 415 of FIG. 4.

In operation, the first program cycle is initiated by a program command or address load command on the I/Ox line. The illustrated command is 80H but this is for purposes of illustration only as the present invention is not limited to any one received command value or received command that is responsible for initiating the PGM_ENABLE. The received command causes the PGM_ENABLE line to go high to initiate the program operation. The PGM_ENABLE signal causes the PUMP_ENABLE signal to go high and turn on the charge pump 400. The charge pump remains on during the data loading operation.

$V_{out\_reg}$ starts from 0V and rises to a target voltage with SWA closed. The target voltage is dependent on the embodiment and can be any voltage required for programming the memory cell (e.g. 20V). Since $V_{out\_reg}$ sees the fixed loading capacitance of the target load 403+parasitic load 401, $V_{out\_reg}$ rises with an RC time constant. Since SWA is closed, $V_{out\_f}$ also tracks $V_{out\_reg}$. $V_{out\_l}$ starts from 0V and rises to the target voltage with the closing of SWB 413.

Once $V_{out\_reg}$ reaches the target voltage, the pump 400 is idling (i.e., turned off or slowed down) with just enough output to maintain the $V_{out\_reg}$ node at the target voltage. This compensates for junction leakage at the $V_{out\_reg}$ node connections.

SWB 413 begins to open and close as shown in FIG. 5. This charges the intentional load 405. As can be seen in the timing diagram, SWA 411 and SWB 413 are clocking in an inverse pattern during the remainder of the first program cycle. SWA 411 is closing to compensate for leakage current by the target load 403. SWB 413 is closing to charge the intentional node and to compensate for leakage current by the intentional load 405.

During the verify cycle, the PUMP_ENABLE signal remains high, SWA 411 is open, and SWB 413 remains closed. This provides a slow, weak charging to $V_{out\_l}$ at the intentional load 405.

During the second program cycle, PUMP_ENABLE remains high. The stored charge in the intentional load 405 is then used to charge up the target load 403 by charge sharing. This is accomplished by closing SWC 415 as shown in FIG. 5. Both SWA 411 and SWB 413 are open when SWC 415 momentarily closes. The charge sharing between $V_{out\_l}$ and $V_{out\_f}$ causes only a minor downward spike in the $V_{out\_reg}$ signal that is substantially reduced from the prior art. The peak reduction results in substantially more stable memory device operation.

The $V_{out\_f}$ signal begins to rise with the charge sharing initiated by closing SWC 415. The initial slope of $V_{out\_f}$ in the timing diagram of FIG. 5 is the result of the charge sharing. SWC 415 then opens and SWA 411 closes to couple the target load 403 to $V_{out\_reg}$ to continue charging up $V_{out\_f}$. For the remainder of the second program cycle, SWA 411 and SWB 413 again clock on and off in an inverse fashion, as shown in the timing diagram, in order to compensate for the leakage current occurring in their respective loads 403, 405.

Figure 6:
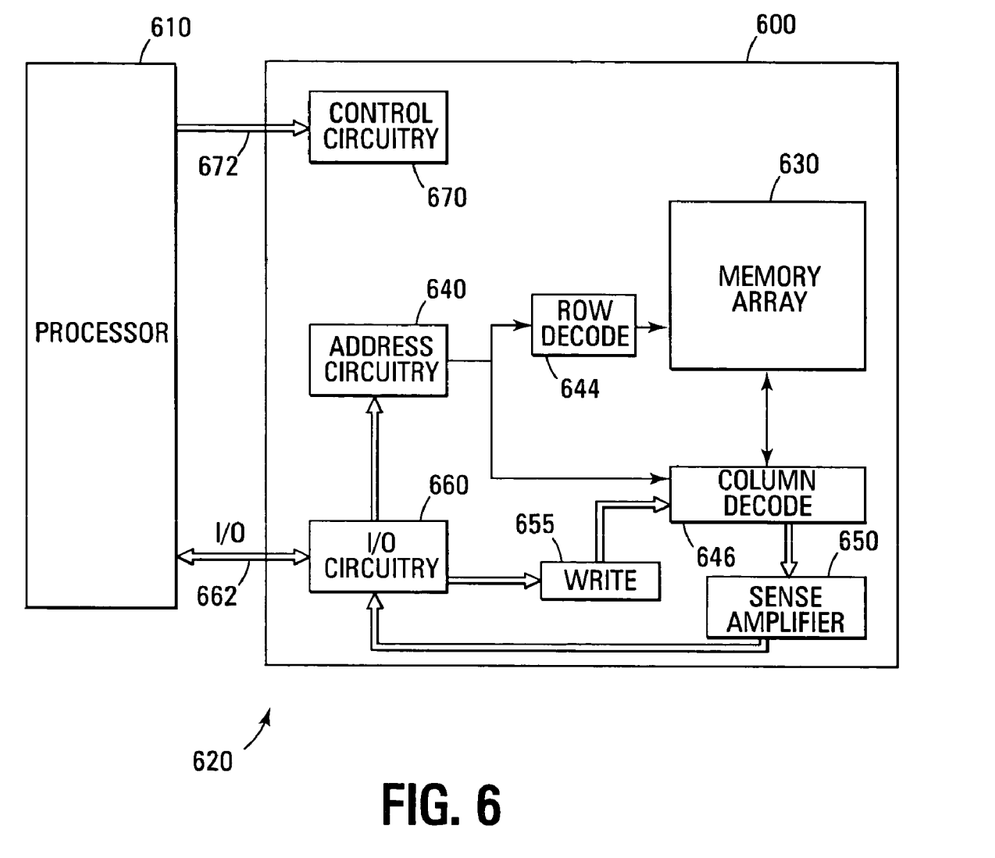
FIG. 6 shows a block diagram for one embodiment of a memory system of the present invention.

FIG. 6 illustrates a functional block diagram of a memory device 600 that can incorporate the embodiments for programming the non-volatile memory cells of the present invention. The memory device 600 is coupled to a processor 610. The processor 610 may be a microprocessor or some other type of controlling circuitry. The memory device 600 and the processor 610 form part of an electronic system 620. The memory device 600 has been simplified to focus on features of the memory that are helpful in understanding the present invention.

The memory device includes an array of flash memory cells 630 or some other type of non-volatile memory cells. The memory array 630 is arranged in banks of rows and columns. The control gates of each row of memory cells is coupled with a word line while the drain and source connections of the memory cells are coupled to bit lines. As is well known in the art, the connection of the cells to the bit lines depends on whether the array is a NAND architecture, a NOR architecture, an AND architecture, or some other array architecture.

An address buffer circuit 640 is provided to latch address signals provided over I/O connections 662 through the I/O circuitry 660. Address signals are received and decoded by row decoders 644 and column decoders 646 to access the memory array 630. It will be appreciated by those skilled in the art that, with the benefit of the present description, the number of address input connections and row/column decoders depends on the density and architecture of the memory array 630. That is, the number of addresses increases with both increased memory cell counts and increased bank and block counts.

The memory integrated circuit 600 reads data in the memory array 630 by sensing voltage or current changes in the memory array columns using sense/buffer circuitry 650. The sense/buffer circuitry, in one embodiment, is coupled to read and latch a row of data from the memory array 630. Data input and output buffer circuitry 660 is included for bi-directional data communication over the I/O connections 662 with the processor 610. Write circuitry 655 is provided to write data to the memory array.

Control circuitry 670 decodes signals provided on control connections 672 from the processor 610. These signals are used to control the operations on the memory array 630, including data read, data write, and erase operations. The control circuitry 670 may be a state machine, a sequencer, or some other type of controller. The control circuitry 670 of the present invention, in one embodiment, is responsible for executing the embodiments of the programming method and charge pump control of the present invention.

The flash memory device illustrated in FIG. 6 has been simplified to facilitate a basic understanding of the features of the memory and is for purposes of illustration only. A more detailed understanding of internal circuitry and functions of flash memories are known to those skilled in the art. Alternate embodiments may include the flash memory cell of the present invention in other types of electronic systems.

Figure 7:
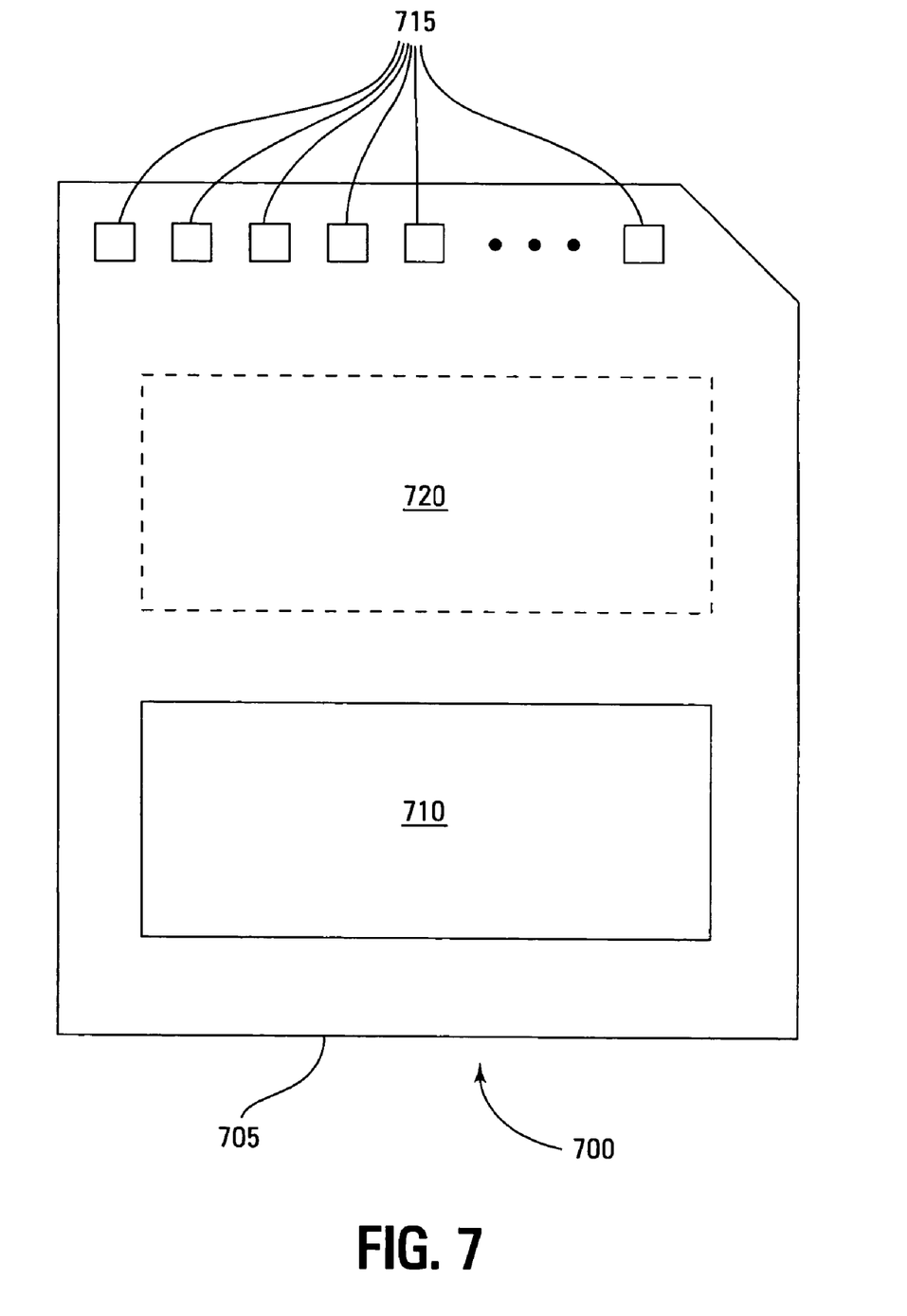
FIG. 7 shows a block diagram for one embodiment of a memory module of the present invention.

FIG. 7 is an illustration of a memory module 700 that incorporates the memory cell embodiments as discussed previously. Although the memory module 700 is illustrated as a memory card, the concepts discussed with reference to the memory module 700 are applicable to other types of removable or portable memory, e.g., USB flash drives. In addition, although one example form factor is depicted in FIG. 7, these concepts are applicable to other form factors as well.

The memory module 700 includes a housing 705 to enclose one or more memory devices 710 of the present invention. The housing 705 includes one or more contacts 715 for communication with a host device. Examples of host devices include digital cameras, digital recording and playback devices, PDAs, personal computers, memory card readers, interface hubs and the like. For some embodiment, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on COMPACTFLASH memory cards licensed by SANDISK Corporation, MEMORY STICK memory cards licensed by SONY Corporation, SD SECURE DIGITAL memory cards licensed by TOSHIBA Corporation and the like. In general, however, contacts 715 provide an interface for passing control, address and/or data signals between the memory module 700 and a host having compatible receptors for the contacts 715.

The memory module 700 may optionally include additional circuitry 720. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of I/O connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710. The additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

CONCLUSION

In summary, the embodiments of the present invention provide stable memory device operation and reduced program time by enabling the charge pump at some point prior to the data load instead of after the data load, as in the prior art. This minimizes the pump driving current during the program cycle start in order to reduce the supply peak current, thus providing stable device operation. Additionally, an intentional load provides charge sharing to reduce the load on the regulated voltage output from the pump during program cycle start.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device comprising:
    a memory array comprising a plurality of memory cells arranged in rows and columns, each row coupled to a word line and each column coupled to a bit line;
    a charge pump circuit coupled to the memory array for generating a programming voltage, the charge pump circuit comprising a charge pump for generating the programming voltage in response to an enable signal, a first load coupled to the charge pump, a second load coupled to the charge pump and to the first load; and
    a memory control circuitry coupled to the charge pump circuit for controlling operation of the charge pump circuit, the memory control circuitry configured to generate the enable signal during a programming operation, the memory control circuitry further configured to control coupling of the first load to the second load while decoupling both the first and second loads from the charge pump circuit for charge sharing only during an initial part of a program cycle of the programming operation.

2. The device of claim 1 wherein the first and second loads are switchably coupled to the charge pump and the second load is switchably coupled to the first load.

3. The device of claim 2 wherein the memory control circuitry is further configured to control charging of the first and second loads substantially to a target voltage during a first programming cycle, to decouple the first load from the charge pump during a subsequent verify cycle, and to couple the second load to the first load during a second, subsequent programming cycle to recharge the first load to a predetermined voltage level.

4. The device of claim 3 wherein the memory control circuitry is further configured to decouple the first load from the second load and recouple the first load to the charge pump such that the first load is recharged from the predetermined voltage level substantially to the target voltage.

5. The device of claim 1 wherein the memory device is a NAND flash memory device.

6. A memory system comprising:
   a processor that generates memory signals; and
   a non-volatile memory device coupled to the processor and operating in response to the memory signals, the device comprising:
      a memory array comprising a plurality of memory cells arranged in rows and columns, each row coupled to a word line and each column coupled to a bit line;
      a charge pump circuit coupled to the memory array for generating a programming voltage, the charge pump circuit comprising a charge pump for generating the programming voltage in response to an enable signal, a first load coupled to the charge pump, a second load coupled to the charge pump and to the first load; and
      a memory control circuitry coupled to the charge pump circuit for controlling operation of the charge pump circuit, the memory control circuitry configured to generate the enable signal during a programming operation prior to a data loading operation of the programming operation, the controller circuit is further configured to control charge sharing between the first and second loads such that a first load voltage is recharged without coupling to the charge pump during an initial portion of a programming cycle of the programming operation.

7. The system of claim 6 wherein the memory signals comprise control signals, data signals, and address signals.

8. A memory module comprising:
   at least two memory devices, each comprising:
      a memory array comprising a plurality of memory cells arranged in rows and columns, each row coupled to a word line and each column coupled to a bit line;
      a charge pump circuit coupled to the memory array for generating a programming voltage, the charge pump circuit comprising a charge pump for generating the programming voltage in response to an enable signal, a first load coupled to the charge pump, a second load coupled to the charge pump and to the first load; and
      a memory control circuitry coupled to the charge pump circuit for controlling operation of the charge pump circuit, the memory control circuitry configured to generate the enable signal during a programming operation prior to a data loading operation of the programming operation, the controller circuit is further configured to control charge sharing between the first and second loads such that a first load voltage is recharged without coupling to the charge pump during an initial portion of a programming cycle of the programming operation; and
   a plurality of contacts configured to provide selective contact between the at least two device and a host system.

9. The module of claim 8 and further including memory controller coupled to the memory device for controlling operation of the memory device in response to the host system.

10. The module of claim 8 wherein the plurality of non-volatile memory cells are flash memory cells arranged in a NAND architecture.

11. A memory module comprising:
   a memory device comprising:
      a memory array comprising a plurality of memory cells arranged in rows and columns, each row coupled to a word line and each column coupled to a bit line;
      a charge pump circuit coupled to the memory array for generating a programming voltage, the charge pump circuit comprising a charge pump for generating the programming voltage in response to an enable signal, a first load coupled to the charge pump, a second load coupled to the charge pump and to the first load; and
      a memory control circuitry coupled to the charge pump circuit for controlling operation of the charge pump circuit, the memory control circuitry configured to generate the enable signal during a programming operation prior to a data loading operation of the programming operation, the controller circuit is further configured to control charge sharing between the first and second loads such that a first load voltage is recharged without coupling to the charge pump during an initial portion of a programming cycle of the programming operation;
   a housing for enclosing the memory device; and
   a plurality of contacts coupled to the housing and configured to provide selective contact between the memory device and a host system.

* * * * *

UNITED STATES PATENT AND TRADEMARK OFFICE
CERTIFICATE OF CORRECTION

| | | |
|---|---|---|
| PATENT NO. | : 7,626,865 B2 | Page 1 of 1 |
| APPLICATION NO. | : 11/451822 | |
| DATED | : December 1, 2009 | |
| INVENTOR(S) | : Chang Wan Ha | |

It is certified that error appears in the above-identified patent and that said Letters Patent is hereby corrected as shown below:

In column 6, line 61, in Claim 1, delete "operation," and insert -- prior to a data loading operation of the programming operation, --, therefor.

In column 8, line 17, in Claim 8, after "two" insert -- memory --.

Signed and Sealed this

Second Day of February, 2010

David J. Kappos
*Director of the United States Patent and Trademark Office*

UNITED STATES PATENT AND TRADEMARK OFFICE
CERTIFICATE OF CORRECTION

PATENT NO. : 7,626,865 B2  Page 1 of 1
APPLICATION NO. : 11/451822
DATED : December 1, 2009
INVENTOR(S) : Chang Wan Ha It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 488 days.

Signed and Sealed this

Twenty-first Day of December, 2010

David J. Kappos
*Director of the United States Patent and Trademark Office*